US006649523B2

(12) United States Patent
Basol et al.

(10) Patent No.: US 6,649,523 B2
(45) Date of Patent: Nov. 18, 2003

(54) METHOD AND SYSTEM TO PROVIDE MATERIAL REMOVAL AND PLANARIZATION EMPLOYING A REACTIVE PAD

(75) Inventors: Bulent M. Basol, Manhattan Beach, CA (US); Cyprian E. Uzoh, Milpitas, CA (US); Homayoun Talieh, San Jose, CA (US)

(73) Assignee: Nutool, Inc., Milpitas, CA (US)

( * ) Notice: Subject to any disclaimer, the term of this patent is extended or adjusted under 35 U.S.C. 154(b) by 0 days.

(21) Appl. No.: 09/969,531

(22) Filed: Oct. 1, 2001

(65) Prior Publication Data

US 2002/0068456 A1 Jun. 6, 2002

Related U.S. Application Data

(60) Provisional application No. 60/236,505, filed on Sep. 29, 2000.

(51) Int. Cl.[7] ...................... H01L 21/302; H01L 21/461
(52) U.S. Cl. ...................... 438/692; 438/693; 438/629; 438/633
(58) Field of Search .................. 438/690–693, 438/689, 629, 633

(56) References Cited

U.S. PATENT DOCUMENTS

| | | | | |
|---|---|---|---|---|
| 4,098,031 A | * | 7/1978 | Hartman et al. ............ 451/390 |
| 4,323,656 A | * | 4/1982 | Strickman et al. ........ 15/104.93 |
| 5,167,747 A | * | 12/1992 | Kadija .................... 156/345.18 |
| 5,348,615 A | * | 9/1994 | Gupta ......................... 216/52 |
| 5,665,252 A | * | 9/1997 | Jin et al. ...................... 216/33 |
| 5,876,266 A | * | 3/1999 | Miller et al. .................. 216/88 |
| 5,929,526 A | * | 7/1999 | Srinivasan et al. .......... 257/758 |
| 6,051,495 A | * | 4/2000 | Burke et al. ................ 438/633 |
| 6,121,143 A | * | 9/2000 | Messner et al. ........ 156/345.12 |
| 6,218,290 B1 | * | 4/2001 | Schonauer et al. ............ 438/12 |
| 6,313,038 B1 | * | 11/2001 | Chopra et al. ................ 216/38 |
| 6,383,065 B1 | * | 5/2002 | Grumbine et al. ........... 451/526 |
| 2002/0068516 A1 | * | 12/2000 | Chen et al. ................. 451/285 |

* cited by examiner

*Primary Examiner*—John F. Niebling
*Assistant Examiner*—Angel Roman
(74) *Attorney, Agent, or Firm*—Pillsbury Winthrop LLP

(57) ABSTRACT

Systems and methods to remove a first material located on a top surface of a workpiece are presented according to one aspect of the present invention. According to an exemplary method, the pad including a second material is positioned proximate to the workpiece so that a front surface of the pad contacts an exposed surface of the first material. The front surface of the pad is mechanically moved against the exposed surface of the first material to initiate a chemical reaction between the first material and the second material that yields a reaction product. The reaction product may be removed by using a chemical solution, by using the mechanical movement of the pad against the exposed surface of the first material or both.

20 Claims, 5 Drawing Sheets

METHOD AND SYSTEM TO PROVIDE MATERIAL REMOVAL AND PLANARIZATION EMPLOYING A REACTIVE PAD

CROSS-REFERENCE TO RELATED APPLICATION

This application claims the benefit of prior U.S. Provisional Application Serial No. 60/236,505, filed Sep. 29, 2000, which is hereby incorporated by reference herein.

TECHNICAL FIELD

The present invention generally relates to semiconductor integrated circuit technology and, more particularly, to techniques for employing a reactive pad in contact with the surface of a workpiece during material removal or planarization.

BACKGROUND

Removal of excess material in a uniform manner from the surface of coated patterned substrates has wide range of applications. One of these applications is in the field of integrated circuit manufacturing. Conventional semiconductor devices such as integrated circuits generally include a semiconductor substrate, usually a silicon substrate, and a plurality of sequentially formed dielectric interlayers such as silicon dioxide, and conductive paths or interconnects made of conductive materials. Copper and copper alloys have recently received considerable attention as interconnect materials because of their superior electromigration and low resistivity characteristics. The interconnects are usually formed by filling a conductor such as copper in features or cavities etched into the dielectric interlayers by a metallization process. In an integrated circuit, multiple levels of interconnect networks laterally extend with respect to the substrate surface. Interconnects formed in sequential layers can be electrically connected using features such as vias or contacts.

In a typical interconnect fabrication process, first an insulating interlayer is formed on the semiconductor substrate. Patterning and etching processes are performed to form features such as trenches, pads and vias etc. in the insulating layer. Then, copper is deposited on the substrate through a metallization process to fill all the features. The preferred method of copper metallization process is electroplating.

FIG. 1 illustrates a cross-sectional view of a substrate 102 such as a wafer with features 104 such as trenches and vias formed into its insulating layer. A material 106, such as copper (Cu) is deposited on the wafer 102 surface over the features 104. In conventional deposition processes, a barrier layer 108, and then, in the case of copper 106 deposition, a very thin copper seed layer to initiate copper growth, are coated onto the insulating layer and into the features of the insulating layer of the wafer 102. The goal of a planarization process is to remove the material 106 from the top surface of the wafer 102, leaving the material 106 only in the features 104. This is presently achieved by a polishing technique such as chemical mechanical polishing (CMP), electropolishing, etching, or a combination of these techniques. The polishing techniques are conducted to remove the excess material 106 layer or material overburden and other conductive layers that are above the top surface of the insulating portions of substrate 102. FIG. 2 shows the cross-section of the same substrate 102 after the polishing technique(s) are applied and the excess conductors are removed. The substrate is planarized so that the material 106 is only in the features 104.

In most commonly used CMP approaches, the substrate 102 surface is contacted with a pad and the pad is moved with respect to the substrate surface. This pad is typically made of a polymeric material which is inert to the material 106. The pad may or may not contain abrasive particles or gels. The hardness of the pad may change in accordance with the material to be removed. Companies such as 3M, Rodel, and Universal Photonics supply CMP pads of various types to the industry. The role of the pad is to polish the surface of the substrate 102 and to remove the material 106 on the surface with the help of, for example, a chemical solution or a slurry containing abrasive particles. Therefore, slurry apart, the role of the pad in prior processes is purely mechanical. Conventionally, chemical reactions occur between the film to be removed and the slurry. The reaction products are then removed by the pad and the abrasive particles.

There are many challenges with the state-of-the art CMP techniques. These include but are not limited to: the pads getting glazed and loosing their efficiency, the stability of the removal rate from run to run, the cost of the consumables, and the defects such as dishing and erosion which are well known and characterized by those skilled in the art and in the field.

The higher the pressure, the higher the metal removal rates during CMP operations. Higher polishing pressures of, for example, three to six pounds per square inch (psi), while practical for strong dielectric films such as silicon dioxide, are problematic for many films with low dielectric constants, such as SOX, SILK, diamond like carbon (DLC), and their likes. This is because they tend to be more fragile than silicon dioxide. In general, CMP operations that occur at low pressures, for example, less than three psi, result in lower metal removal rates, hence lower process throughput and higher operating costs.

To this end, it would be desirable to have a more efficient method and system for providing material removal and planarization of the surface of a substrate such as a semiconductor wafer surface.

SUMMARY

The presently preferred embodiments described herein include systems and methods for providing material removal and planarization of the surface of a workpiece such as, for example, a semiconductor device or wafer, a packaging substrate, or a magnetic device, using a reactive pad.

A method of removing a first material located on a top surface of a workpiece using a pad positioned proximate to the workpiece is presented according to one aspect of the present invention. The pad is positioned proximate to the workpiece so that a front surface of the pad contacts an exposed surface of the first material. The pad includes a second material. The front surface of the pad is mechanically moved against the exposed surface of the first material to initiate a chemical reaction between the first material and the second material. The chemical reaction yields a reaction product. The reaction product is removed using a chemical solution. The reaction product is soluble into the chemical solution and the first material and second material are not substantially soluble into the chemical solution.

A method of removing a first material located on a top surface of a workpiece using a pad positioned proximate to the workpiece is presented according to another aspect of the present invention. The pad is positioned proximate to the workpiece so that a front surface of the pad contacts an exposed surface of the first material. The pad includes a second material. The front surface of the pad is mechanically moved against the exposed surface of the first material to initiate a chemical reaction between the first material and the second material. The chemical reaction yields a reaction product. The reaction product is removed using the mechanical movement of the front surface of the pad against the exposed surface of the first material. The mechanical movement is not sufficient to remove the first material but is sufficient to remove the reaction product.

A method of removing a first material located on a top surface of a workpiece using a pad positioned proximate to the workpiece is presented according to a further aspect of the present invention. The pad is positioned proximate to the workpiece so that a front surface of the pad contacts an exposed surface of the first material. The pad includes a second material. The front surface of the pad is mechanically moved against the exposed surface of the first material to initiate a chemical reaction between the first material and the second material. The chemical reaction yields a reaction product. The reaction product is removed using a chemical solution and the mechanical movement of the front surface of the pad against the exposed surface of the first material. The reaction product is soluble into the chemical solution and the first material and second material are not substantially soluble into the chemical solution. The mechanical movement is not sufficient to remove the first material but is sufficient to remove the reaction product.

A method of removing a material on a surface of a workpiece using a reactive pad positioned in very close proximity to the workpiece is presented according to another aspect of the present invention. The pad is sufficiently close to the workpiece, while not touching the workpiece during the material removal process. The reactive pad and workpiece may vibrate and or move mechanically with respect to each other during the materials removal process and the removal rate is independent of the applied pressure.

A method of removing a material from a surface of a workpiece using a reactive pad positioned sufficiently near to the workpiece, such that the reactive pad barely touches the surface of the material to be removed, and so that the reactive pad is subjected to near zero deformation or non-significant deformation with respect to its thickness, is presented according to a further aspect of the present invention. The reactive pad and the workpiece may vibrate or move mechanically with respect to each other during the material removal process.

A method of removing a material from a surface of a workpiece using a combination pad, is presented according to another aspect of the present invention. The combination pad material is a combination of a reactive pad and a conventional mechanical pad, such that some portions of the combination pad material include a reactive pad material and other portions of the combination pad material include conventional mechanical pad material. During the material planarization process, the workpiece is positioned very close to the pad so as to be in contact with the combination pad material. Both the workpiece and the combination pad material move with respect to each other.

A method and arrangement of removing a material from a surface of a workpiece using a combination of a reactive pad and a mechanical pad, such that the reactive pad is positioned adjacent to a mechanical pad, is presented according to a further aspect of the present invention. During planarization of the workpiece, the workpiece may vibrate or move mechanically with respect to the pad. Some portions of the material on the workpiece are removed using the reactive pad, while other portions of the material are removed using the mechanical pad.

BRIEF DESCRIPTION OF THE DRAWINGS

The foregoing and other features, aspects, and advantages will become more apparent from the following detailed description when read in conjunction with the following drawings, wherein.

DETAILED DESCRIPTION OF THE PRESENTLY PREFERRED EMBODIMENTS

The present invention will now be described in detail with reference to the accompanying drawings, which are provided as illustrative examples of preferred embodiments of the present invention.

Figure 1:
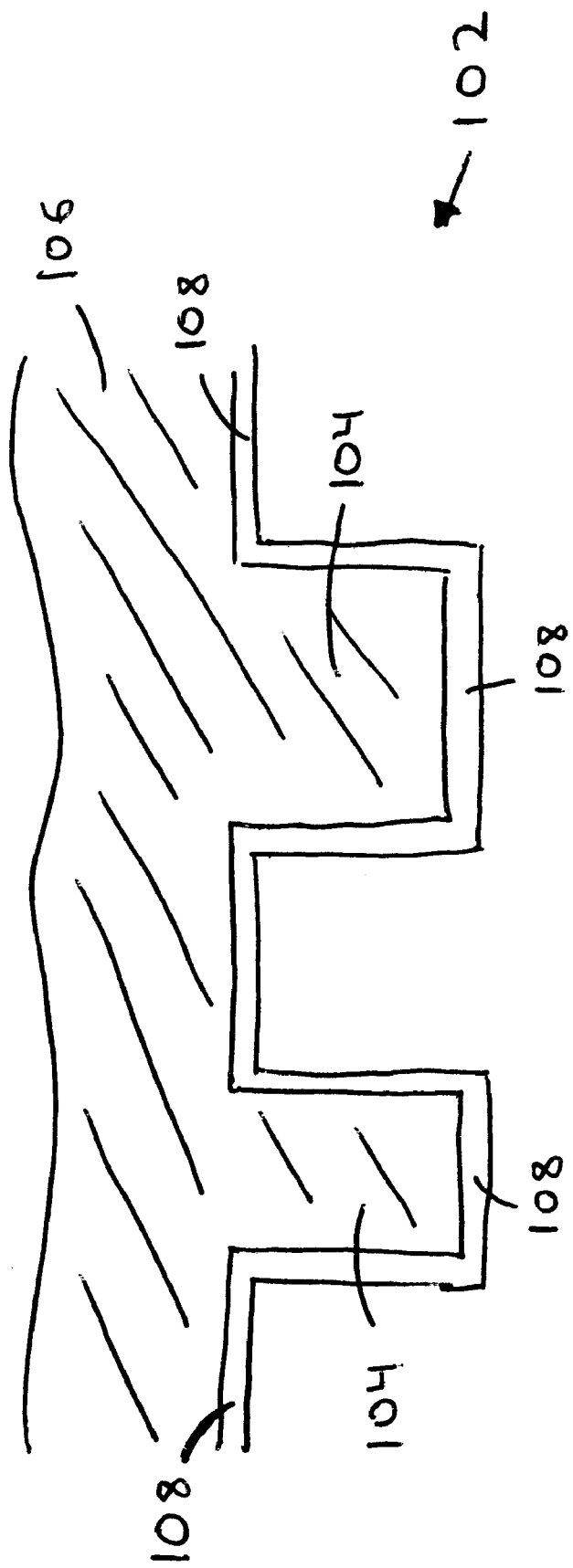
FIG. 1 is a diagram illustrating a cross-sectional view of an exemplary substrate with material overburden deposited on the surface of the substrate.
Figure 2:
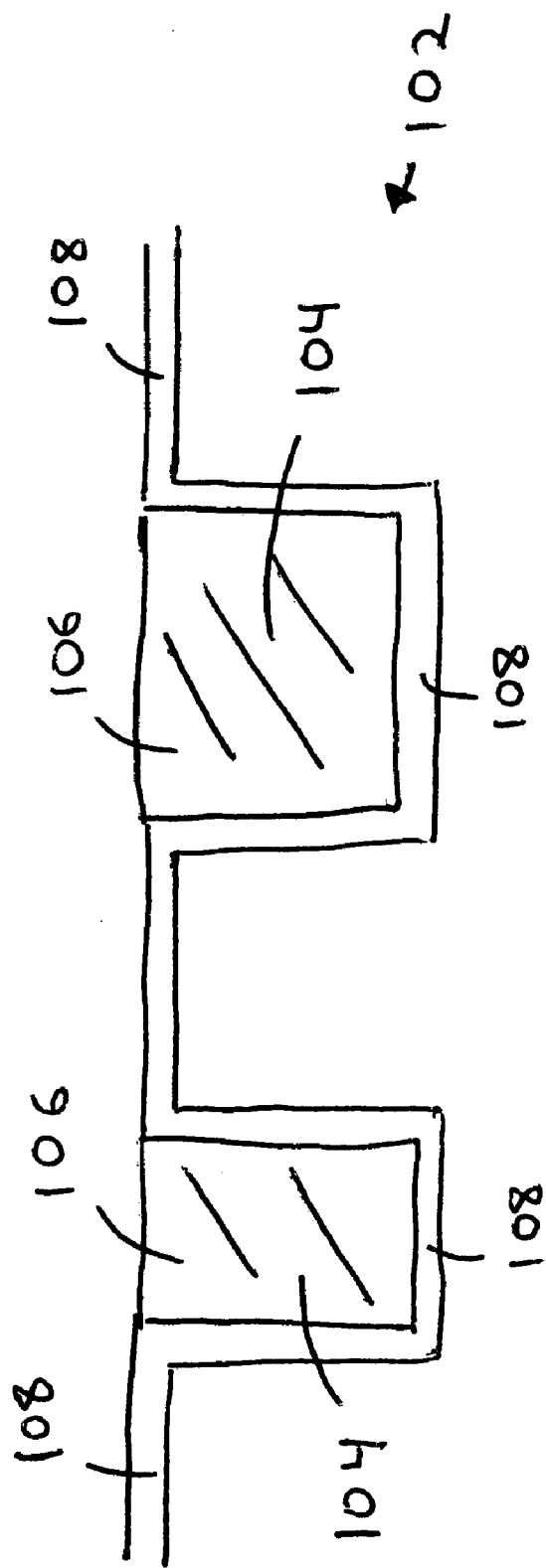
FIG. 2 is a diagram illustrating a cross-sectional view of an exemplary substrate following removal of the material overburden from the surface of the substrate.
Figure 3:
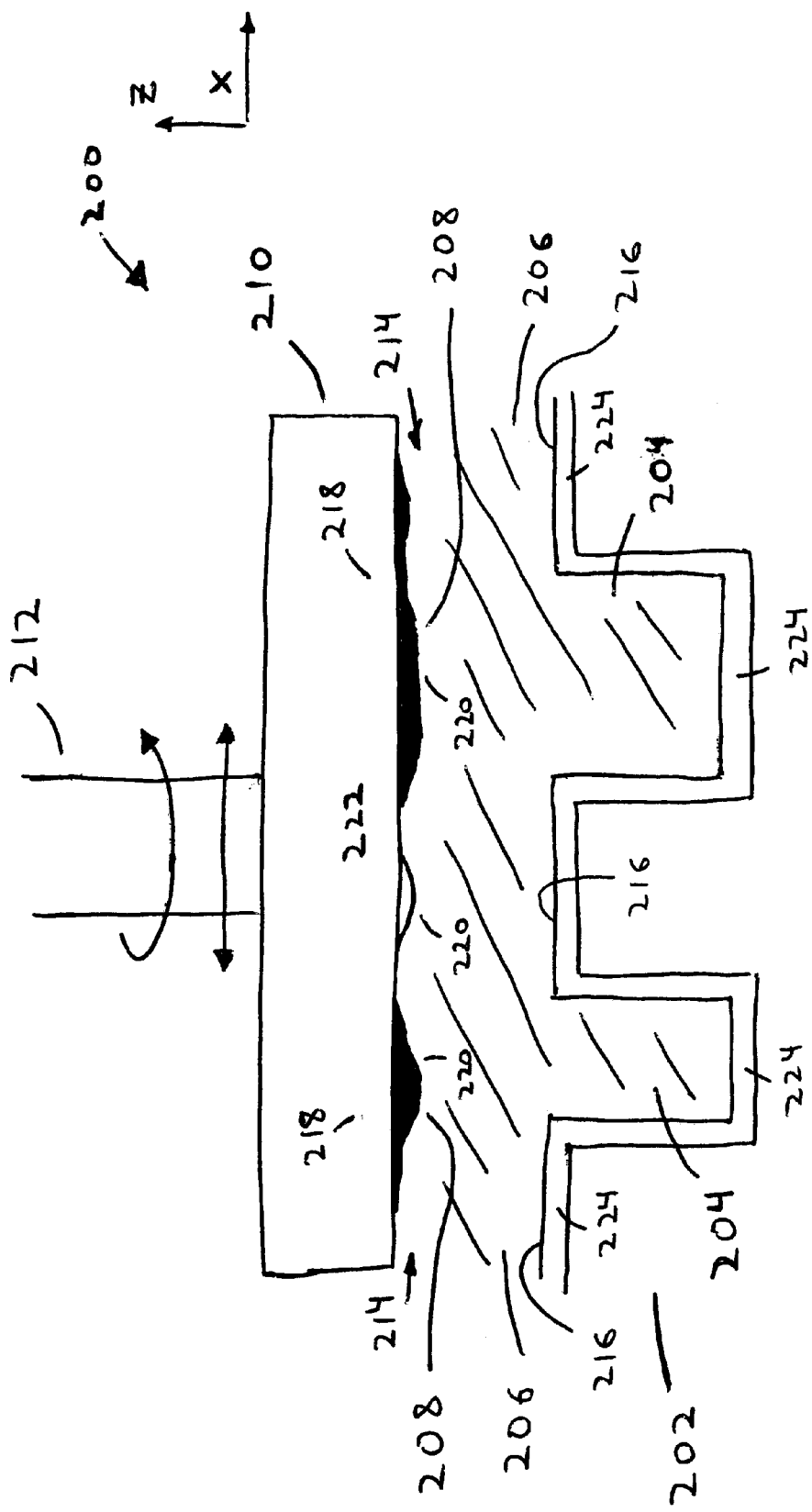
FIG. 3 is a diagram illustrating a cross-sectional view of an exemplary substrate with material overburden deposited on a top surface of the substrate and a reactive pad according to a presently preferred embodiment of the present invention.

Referring now to FIG. 3, it is a diagram illustrating a cross-sectional view of an exemplary material removal system 200 according to a presently preferred embodiment of the present invention. The system 200 includes a reactive pad 210 to remove a material 206 overburden from an exemplary substrate 202. The material 206 is deposited on a top surface 216 of the substrate 202. The material removal system 200 preferably provides planar polishing of the substrate 202 top surface 216 so that the material 206 only remains in features 204 such as trenches and vias formed into an insulating layer of the substrate 202. The pad 210 is mounted on a shaft 212 and can be brought into direct contact with the material 206 overburden on the top surface 216 of the substrate 202. It should be noted that there may be various methods of mounting or holding the pad 210, the details of which have not been shown for clarity. All approaches that are presently used to hold conventional pads are applicable to holding the pad 210 of the present invention. Also the relative positions of the substrate 202 and the pad 210 may be reversed, i.e. the surface of the substrate may be above the surface of the pad 210. The pad 210 may be moved rotationally, which may be clockwise or counter clockwise, or the pad 210 can be moved laterally along the x-axis of the substrate 202, or the pad 210 can be both rotated and moved laterally. The pad 210 may also be moved vertically along the z-axis shown in FIG. 3. It is noted, however, that the above description described rotation and movement of the pad 210, while assuming that the substrate 202 was stationary. It is understood that the system 200, as described above, will allow for either the pad 210 or the substrate 202 to move, or for both of them to move, thereby creating the same relative motion effect. Furthermore the pad 210 may be in the form of a belt and its motion may be linear. For ease of description, however, the invention was above-described and will continue to be described in terms of movement of the pad 210.

The workpiece or substrate 202 may be, for example, a silicon wafer plated with a conductor metal material 206, preferably copper or copper alloy. The material 206, such as copper, is deposited on the substrate 102 surface over the features 204. A barrier layer 224, and then, in the case of copper 206 deposition, a very thin copper seed layer to initiate copper growth, are coated onto the insulating layer of the substrate 202 and into the features 204 of the insulating layer of the substrate 202. The barrier layer 224, which may also be referred to as a glue layer 224 since it effectively glues copper to the insulating layer, can be made up of bilayers such as, for example, a tantalum (Ta)/tantalum nitride (TaN) bilayer or a titanium (Ta)/titanium nitride (TiN) bilayer. The pad 210 is preferably capable of performing planar polishing of the substrate 202 top surface 216 so that the material 106 is left only in the features 204. It should be understood that the barrier layer 224 that is over the insulating layer can also be removed using the pad 210, if the pad 210 is so configured. The pad 210 may also be specifically configured for the purpose of removing portions of the barrier layer 224 so that the material 206 is electrically and physically isolated throughout the features 204. A chemical solution 214 such as an electrolyte, depicted by arrows 214, is preferably applied between a front surface 218 of the pad 210 and an exposed surface 220 of the material 206 to aid in material 206 removal.

The pad 210 removes material 206 overburden from the top surface 216 of the workpiece or substrate 202 in a chemical way as well as a mechanical way. The pad 210 preferably contains a chemical species 222, or is made of a chemical species 222, that can react with the exposed surface 220 of the material 206. This is achieved by physical contact and motion between the front surface 218 of the pad 210 and the exposed surface 220 of the material 206 on the top surface 216 of the substrate 202. The chemical reaction between the pad 210 and the exposed surface 220 of the material 206 may involve an alloying or an exchange reaction. As is known to those skilled in the art, alloying or exchange reactions may result from the physical work done against the frictional forces between the two surfaces 218, 220. One example of such a reaction can be seen using a reactive pad 210 that includes, for example, very finely dispersed ferric nitrate as the primary oxidant. During the polishing step, the ferric ion is reduced to a ferrous ion, while the copper on the substrate is oxidized to cupric ions. In another example, in a reactive pad 210 that includes calcium peroxide, the peroxide oxidizes the copper or metal 206 on the substrate 202, to form copper oxide. The resulting reduced calcium acts as a very mild abrasive for the removal of the copper oxide, thus exposing a new copper layer beneath. This is an example of an in situ generated abrasive material or particulate during the planarization process. Any products of the chemical reaction occurring between the pad 210 chemical species 222 and the material 206 exposed surface 220 are then removed by the chemical solution 214 present between the pad 210 and the substrate 202 top surface 216, or are removed physically by the pad 210, or both chemical and mechanical mechanisms may help in this removal. When the excess material 206 on the top surface 216 is removed, contact between the pad 210 front surface 218 and the material 206 within the features 204 is lost, therefore, reaction between the material 206 and the pad 210 stops. This automatically stops material removal and thus avoids dishing of the material 206 in the feature 204 regions.

There are several conditions that are to be satisfied for the material removal process to work properly in a presently preferred embodiment. First, the chemical species 222 contained on the pad 210 or on the front surface 218 of the pad 210 that contacts the exposed surface 220 of the material 206 should react with the exposed surface 220 of the material 206 to form reaction products 208. Second, the products 208 resulting from the chemical reaction should be chemically different from the material 206 on the substrate 202 as well as from the chemical species 222 contained on the pad 210. Third, the products 208 resulting from the chemical reaction, but not the pad 210 or the material 206 on the substrate 202 top surface 216, should be substantially soluble in the chemical solution 214, e.g., an electrolyte, or the reaction products 208 should be such that the products 208 can be easily removed from the top surface 216 of the substrate 202 by physical action of the pad 210, by chemical action of the electrolyte 214, or both.

Figure 4:
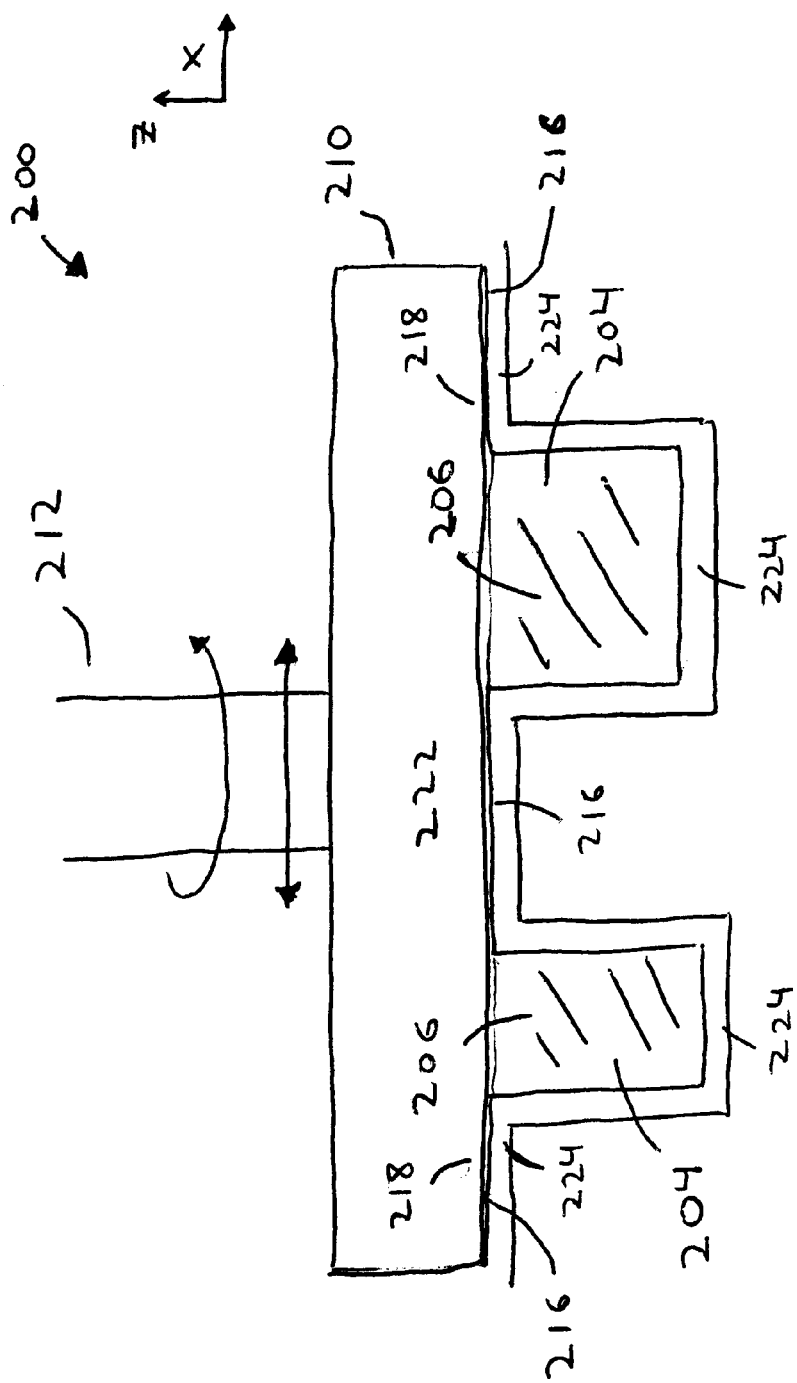
FIG. 4 is a diagram illustrating a cross-sectional view of the exemplary substrate and reactive pad of FIG. 3 following removal of the material overburden from the top surface of the substrate.

As an example referring to FIG. 3, assume that the pad 210 is made of a chemical species 222 material "A." Further assume that the material 206 that coats the top surface 216 of the substrate 202 is the material "B." To remove the material B 206 from the top surface 216 of the substrate 202, the front surface 218 of the pad 210 is brought into contact with the exposed surface 220 of the material B 206 and the pad 210 is preferably moved with respect to the top surface 216 of the substrate 202. The physical rubbing between the species material A 222 pad 210 and the material B 206 causes a reaction product $A_XB_Y$ 208 formed either on the exposed surface 220 of the material B 206 or on the front surface 218 of the pad 210, or both. In the reaction product compound $A_XB_Y$ 208, X and Y represent stoichiometric and non-stoichiometric numbers, as applicable. In one exemplary scenario, the reaction product $A_XB_Y$ 208 is preferably exposed to an electrolyte solution 214 that does not dissolve species A 222 or material B 206 appreciably but that chemically attacks and removes the reaction product $A_XB_Y$ 208. Similarly, in another exemplary scenario, the mechanical action of the pad 210 by itself may not efficiently remove material B 206, but the mechanical properties of the reaction product $A_XB_Y$ 208 are such that pad 210 is able to remove $A_XB_Y$ 208 efficiently regardless. In both exemplary scenarios, the removed reaction product $A_XB_Y$ 208 takes away with it some material B 206 from the top surface 216 of the substrate 202. A planar material removal process continues until the front surface 218 of the pad 210 loses contact with the exposed surface 220 of material B 206. This happens when all, or substantially all, of the material B 206 is removed from the top surface 216 and is left only in the features 204 of the substrate 202, as can be seen in FIG. 4.

It should be understood that the methods and systems described herein according to the present invention can be applied to polish a wide variety of workpieces and to remove many different materials, including barrier materials, from a wide variety of workpieces.

As an example, in the case of copper planarization or removal by the reactive pad 210, the pad 210 material, normally a polymer such as polyurethane, polyester, polyether and their different combinations, may be formulated to incorporate organic or inorganic agents, or combinations of these that will react with the metal material 206 to be polished. Organic and inorganic nitrites and nitrates, in various chemical forms, be it as a powder, micro or nanogel, can be compounded into the matrix of the pad 210 material.

In another embodiment, finely dispersed abrasive particles or powder, such as alumina, silica, silicon carbide, titanium borides, and others may be compounded in conjunction with the reactive agents A 222, into the structure of the pad 210. During the material B 206 removal process, the pad 210 abrades the surface of the material B 206, e.g. copper, while the reactive agent A 222 chemical interacts with the material B 206 metallic or copper layer to the $Cu_XA_Y$ compound.

The electrolyte 214, for instance, may be deionized water. The removal rate of copper 206 from the top surface 216 of the substrate 202 may be controlled by the chemical activity of chemical species A 222 at the front surface 218 of the pad 210. It should be understood that this chemical activity is equivalent to the concentration of the very reactive components of agent A 222 that participate in the reaction with copper, and not necessarily the concentration in the pad 210. This removal rate of copper 206 is controlled by chemical activity of species material A 222 at the exposed surface 220 of copper 206. In one instance, the higher the chemical activity of the reactive agent A 222, the higher the removal rate of copper 206. The chemical activity of the reactive agent A 222 for instance can be increased by increasing the temperature of the electrolyte 214, by increasing the electrolyte 214 flow rate, or by modifying the electrolyte 214 pH. For instance, lowering the electrolyte 214 pH from 6.5 to 4 may increase the activity of agent A 222 by, for example, an order of three, thus increasing the removal of copper 206.

Besides electrolyte 214 temperature, pH, and flow rate, metal 206 removal from the top surface 216 of the substrate 202 may be increased by adding a third agent C in the electrolyte. For example, a small amount of ethyl acetate may be added as a catalyst to the electrolyte to further increase the dissolution of copper 206 or to enhance the formulation of the reaction product 220 $A_XB_Y$ type compound.

Other reactive agents 222 that may be formulated into the structure of the pad 210 material, alone or in their various combinations, include, for example, citric acid, citrates, oxalates, tartaric acid, tartarates, amines, iodine, iodates, amines, carbonates, diamines, ethylenediamine tetraacetic acids, ammonium compounds, chlorates or perchlorates, salicylic acid, sulfosalicylic acids, organic peroxides or inorganic peroxides, such as calcium peroxide or organic peroxides. These reactive agents 222 in the pad 210 may be used to remove other materials 206 such as nickel, aluminum, tungsten, copper alloys, cobalt, silver alloys, iron, tantulum, titanium, chromium, platinum, and others.

Typically, $Cu^{2+}$ ions are formed from the chemical reaction between copper 206 and the reactive agent A 222, which are readily soluble in the electrolyte, but also $Cu^{2+}$ oxides, or chelates can be formed, which can be removed by the mechanical action of the front surface 218 of the pad 210 against the exposed surface 220 of the material B 206 copper.

In some material B 206 metal removal steps, it is preferable that reagents, i.e., the byproducts or products of the reaction, producing uncharged complexes or chelates be formed over the surface of the metal film 206. The complex is then removed by mild abrasive action of the pad 210. Without the action of the pad 210, the uncharged chelate leaves a thin passivating film over the exposed surface 220 of the metal 206.

In other pad 210 material formulations, reagents giving charged complexes or chelates may be preferred, this may include peroxides, oxalates, tartarates, polyamines, citrates, and others. In this case, it is preferable that small amounts of a masking agent such as any of the triazole moieties, for example, benzotriazole (BTA), be co-compounded into the pad material or be added into the electrolyte to control the removal rate. Thus at a lower amount of masking agent, typically below ten (10) parts per million (ppm), a certain removal rate is obtained, and for instance at above 50 ppm of the masking material, negligible removal rate is observed.

Thus the addition of a masking agent in the electrolyte 214 may be used to control the removal rate of material B 206 metal film from the substrate. Besides the addition of sulfur bearing groups such as BTA to control the removal rate, the removal rate may also be controlled by adding a surfactant or a material that may increase the viscosity of the electrolyte 214. For example, glycerol, or members of polyols or the glycerol family, may be added to the electrolyte 214. The addition of glycerol moderates the activity of the reactive agent 222 in the pad, nominally by increasing the viscosity of the electrolyte. Glycerol has an additional beneficial effect of acting as a lubricant between the substrate 202 and the front surface 218 of the pad 210.

In another embodiment of this invention, during the material 206 removal process, the reactive pad 210 is disposed sufficiently close to the top surface 216 of the workpiece 202, while not touching the workpiece 202. During the material 206 removal from the top surface 216 of the workpiece 202, it is preferred that the workpiece 202 and the pad 210 vibrate, and/or move mechanically with respect to each other without touching. In this movement and/or vibration, material 206 removal occurs predominantly by etching process. Thus, materials 206 on the substrate can be chemically etched using reactive agents 222 in the reactive pad 210.

In other embodiments, all that may be needed for material 206 removal is that the workpiece 202 gently touch or brush the front surface 218 of the reactive pad 210, during the material 206 removal process step. The workpiece 202 is sufficiently close and lightly to the pad 210 material, such that there is no significant deformation of the reactive pad 210 material compared to a conventional CMP process. In this removal configuration, the removal process is the interplay between etching and mechanical removal, with minimal damage to the top surface 216 of the workpiece 202. In these removal processes, there is no significant deformation of the pad 210 material, the role of the applied pressure is minimal. Thus the removal rate can be nearly independent of the applied pressure. This type of planarization process, where the pad 210 and workpiece 202 are in very close proximity and float over each other, is very beneficial in the planarization of comparatively fragile materials 206, such as many low dielectric constant (K) films.

Figure 5:
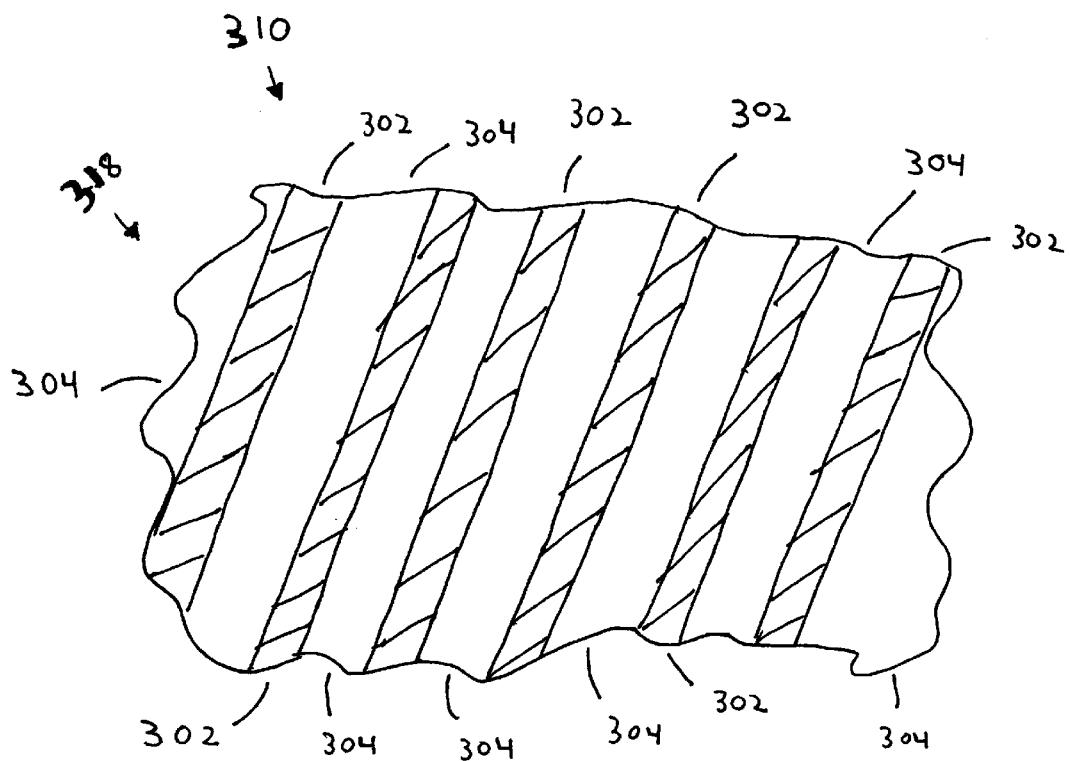
FIG. 5 is a diagram illustrating a partial view of a front surface of an exemplary embodiment of the reactive pad of FIG. 3 that includes a combination of reactive and mechanical pad material.

In another embodiment according to the present invention, an arrangement consisting of the combination of a reactive pad positioned adjacent to a mechanical pad is described. Referring now to FIG. 5, it is a diagram illustrating a partial view of a front surface 318 of an exemplary embodiment 310 of the reactive pad 210 of FIG. 3 that includes a combination of reactive and mechanical pad material. As shown in FIG. 5, strips 302, 304 of reactive 302 and mechanical 304 pad are disposed as alternating layers in the pad 310. Of course, different geometrical arrangements or configurations may be used. For example, reactive pad portions 302 preferably range between five to seventy percent, the balance being conventional mechanical pad portions 304, or vice versa. During the planarization process, portions of the material B 206 to be removed are removed by the reactive pad sections 302, while other portions are removed by the mechanical pad sections 304.

Figure 6:
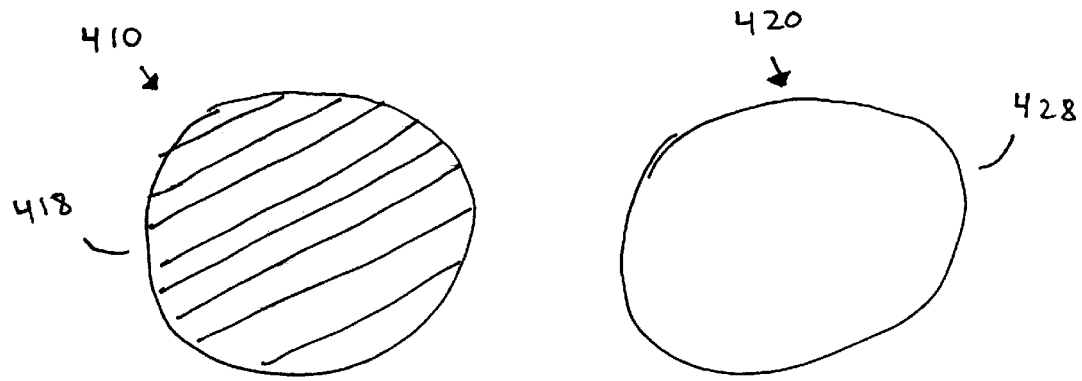
FIG. 6 is a diagram illustrating a view of a front surface of an exemplary embodiment of the reactive pad of FIG. 3 that includes reactive pad material and of a front surface of a conventional mechanical pad placed alongside the reactive pad.

In other embodiments, a fully reactive pad 410 is positioned adjacent to, but separately from, a conventional mechanical pad 420. Referring to FIG. 6, it is a diagram illustrating a view of a front surface 418 of an exemplary embodiment 410 of the reactive pad 210 of FIG. 3 and of a front surface 428 of the mechanical pad 420 placed alongside the reactive pad 410. During the material 206 removal process step, the workpiece 202 is planarized for some period or portion of time using the reactive pad 410, and for other portion of time using the conventional pad 420. For example, for higher removal rates, the planarization may occur predominantly over the reactive pad 410 top surface 418. However, when workpiece 202 surface 216 smoothness is of primary importance, an appropriate combination of planarization times over both pads 410, 420 may be used. Thus, in some applications, the workpiece 202 may move sequentially over, or under, both the reactive pad 210 and the non reactive pad. In other material removal steps, for example, the workpiece 202 may reside longer over the reactive pad 210 than the non reactive mechanical pad 428 and vice versa during the material 206 removal process.

Although the present invention has been particularly described with reference to the preferred embodiments, it should be readily apparent to those of ordinary skill in the art that changes and modifications in the form and details may be made without departing from the spirit and scope of the invention. It is intended that the appended claims include such changes and modifications.

What is claimed is:

1. A method of removing a first material located on a top surface of a workpiece using a pad positioned proximate to the workpiece, the method comprising:

positioning the pad proximate to the workpiece so that a front surface of the pad contacts an exposed surface of the first material, at least the front surface of the pad being made of a second material;

moving the front surface of the pad against the exposed surface of the first material to initiate a chemical reaction between the first material and the second material, the chemical reaction yielding a reaction product; and removing the reaction product using a chemical solution, the reaction product being soluble into the chemical solution, and the first material and the second material not being substantially soluble into the chemical solution.

2. The method according to claim 1, further comprising:

rotating, vertically moving, and laterally moving the pad relative to the workpiece using a shaft coupled to the pad.

3. The method according to claim 2, wherein the pad is wholly comprised of the second material.

4. The method according to claim 2, wherein the second material is stored within the pad.

5. A method of removing a first material located on a top surface of a workpiece using a pad positioned proximate to the workpiece, the method comprising:

positioning the pad proximate to the workpiece so that a front surface of the pad contacts an exposed surface of the first material, at least the front surface of the pad being made of a second material;

moving the front surface of the pad against the exposed surface of the first material to initiate a chemical reaction between the first material and the second material, the chemical reaction yielding a reaction product; and removing the reaction product using the movement of the front surface of the pad, wherein moving the front surface of the pad against the exposed surface of the first material is not sufficient to remove the first material but is sufficient to remove the reaction product.

6. A method of removing a first material located on a top surface of a workpiece using a pad positioned proximate to the workpiece, the method comprising:

positioning the pad proximate to the workpiece so that a front surface of the pad contacts an exposed surface of the first material, at least the front surface of the pad being made of a second material;

moving the front surface of the pad against the exposed surface of the first material to initiate a chemical reaction between the first material and the second material, the chemical reaction yielding a reaction product; and removing the reaction product using a chemical solution and the movement of the front surface of the pad, the reaction product being soluble into the chemical solution, the first material and the second material not being substantially soluble into the chemical solution, wherein moving the front surface of the pad against the exposed surface of the first material is not sufficient to remove the first material but is sufficient to remove the reaction product.

7. A method of removing a first material located on a top surface of a workpiece using a pad positioned proximate to the workpiece, the method comprising:

positioning the pad proximate to the workpiece so that a front surface of the pad is sufficiently close to an exposed surface of the first material but does not touch the exposed surface of the first material, the pad comprising a second material;

moving the pad with respect to the workpiece to initiate a chemical reaction between the first material and the second material, the chemical reaction yielding a reaction product; and removing the reaction product using a chemical solution, the reaction product being soluble into the chemical solution, and the first material not being substantially soluble into the chemical solution.

8. The method according to claim 7, wherein the second material is not substantially soluble into the chemical solution.

9. The method according to claim 7, wherein the reaction product is removed predominantly using the chemical solution and not by using the movement of the pad so that a removal rate of the first material is independent of a pressure applied between the pad and the workpiece.

10. A method of removing a first material located on a top surface of a workpiece using a pad positioned proximate to the workpiece, the method comprising:

positioning the pad proximate to the workpiece so that a front surface of the pad is sufficiently close to an exposed surface of the first material and contacts the exposed surface of the first material so that the pad is subjected to minimal deformation with respect to a thickness of the pad, at least the front surface of the pad being made of a second material;

moving the pad against the exposed surface of the first material and with respect to the workpiece to initiate a chemical reaction between the first material and the second material, the chemical reaction yielding a reaction product; and removing the reaction product using a chemical solution and the movement of the pad, the reaction product being soluble into the chemical solution, and the first material not being substantially soluble into the chemical solution.

11. The method according to claim 10, wherein the second material is not substantially soluble into the chemical solution.

12. The method according to claim 10, further comprising:

removing the first material using the movement of the pad.

13. The method according to claim 12, wherein a removal rate of the first material is nearly independent of a pressure applied between the pad and the workpiece.

14. The method according to claim 13, wherein the step of positioning subjects the pad to minimal deformation with respect to a thickness of the pad.

15. A method of removing a first material located on a top surface of a workpiece using a combination pad positioned proximate to the workpiece, the method comprising:

positioning the combination pad proximate to the workpiece so that a front surface of the combination pad contacts an exposed surface of the first material, the combination pad comprising a combination of a reactive pad material and a mechanical pad material;

moving the front surface of the combination pad against the exposed surface of the first material to initiate a chemical reaction between the first material and the reactive pad material, the chemical reaction yielding a reaction product;

removing the reaction product using a chemical solution, the reaction product being soluble into the chemical solution, and the first material not being substantially soluble into the chemical solution; and removing the first material and the reaction product using the mechanical pad material of the combination pad during the movement of the front surface of the combination pad.

16. The method according to claim 15, wherein the reactive pad material is not substantially soluble into the chemical solution.

17. A method of removing a first material located on a top surface of a workpiece using a first pad having a first front surface and a second pad having a second front surface, the first pad positioned adjacent to, but separately from, the second pad, the method comprising:

positioning the first pad and the second pad proximate to the workpiece so that at least one of the first surface and the second surface contact an exposed surface of the first material, the first pad comprising a reactive pad material and the second pad comprising a mechanical pad material;

moving the first front surface of the first pad against the exposed surface of the first material to initiate a chemical reaction between the first material and the reactive pad material of the first pad, the chemical reaction yielding a reaction product; and removing the reaction product using a chemical solution, the reaction product being soluble into the chemical solution, and the first material not being substantially soluble into the chemical solution.

18. The method according to claim 17, wherein the reactive pad material of the first pad is not substantially soluble into the chemical solution.

19. The method according to claim 18, further comprising:

moving the second front surface of the second pad against the exposed surface of the first material.

20. The method according to claim 19, further comprising:

removing the first material using the mechanical pad material of the second pad during the movement of the second front surface of the second pad.

* * * * *